(12) United States Patent  (10) Patent No.: US 8,075,165 B2
Jiang et al.  (45) Date of Patent: Dec. 13, 2011

(54) TOTAL INTERNAL REFLECTION LENS AND MECHANICAL RETENTION AND LOCATING DEVICE

(75) Inventors: Wu Jiang, Sunnyvale, CA (US); Justin Ware, Santa Clara, CA (US)

(73) Assignee: LedEngin, Inc., Santa Clara, CA (US)

( * ) Notice: Subject to any disclaimer, the term of this patent is extended or adjusted under 35 U.S.C. 154(b) by 290 days.

(21) Appl. No.: 12/420,802

(22) Filed: Apr. 8, 2009

(65) Prior Publication Data

US 2010/0091499 A1 Apr. 15, 2010

Related U.S. Application Data

(60) Provisional application No. 61/105,407, filed on Oct. 14, 2008.

(51) Int. Cl.
*F21V 5/00* (2006.01)
*F21V 7/00* (2006.01)

(52) U.S. Cl. ........ 362/308; 362/327; 362/310; 362/455; 362/249.02

(58) Field of Classification Search ............. 362/249.02, 362/307–310, 327, 455, 268, 545, 230, 231, 362/235, 245, 246, 329, 326, 362, 368, 375, 362/456, 800
See application file for complete search history.

(56) References Cited

U.S. PATENT DOCUMENTS

| 5,742,120 A | 4/1998 | Lin |
| 5,959,316 A | 9/1999 | Lowery |
| 6,307,160 B1 | 10/2001 | Mei et al. |
| 6,351,069 B1 | 2/2002 | Lowery et al. |
| 6,608,332 B2 | 8/2003 | Shimizu et al. |
| 6,614,179 B1 | 9/2003 | Shimizu et al. |
| 6,642,652 B2 | 11/2003 | Collins, III et al. |
| 6,680,128 B2 | 1/2004 | Mei |
| 6,755,556 B2 * | 6/2004 | Gasquet et al. ............... 362/329 |

(Continued)

FOREIGN PATENT DOCUMENTS

JP 2000-349346 12/2000

(Continued)

OTHER PUBLICATIONS

Non-Final Office Action for U.S. Appl. No. 12/420,800, mailed on Sep. 28, 2010, 11 pages.

(Continued)

*Primary Examiner* — Bao Q Truong
(74) *Attorney, Agent, or Firm* — Kilpatrick Townsend & Stockton LLP

(57) ABSTRACT

A lens assembly includes a total internal reflection lens and a lens holder. The lens includes a body member having an outer surface shaped to provide total internal reflection and an interior open channel extending longitudinally through the body member. The body member has a first end region for accommodating a light source and a second end region that includes a plurality of refractive surface regions positioned around the open channel. The lens holder has a concave interior surface shaped to accommodate the optical body member of the lens and a convex exterior surface. The holder has multiple clips for securing the lens. The holder also has three or more support members extending from the exterior surface toward the first end. The support members are adapted for centering the optical body member with respect to the light source and maintaining the light source in the specified position in relation to the optical body member.

10 Claims, 15 Drawing Sheets

U.S. PATENT DOCUMENTS

| | | | |
|---|---|---|---|
| 6,791,116 B2 | 9/2004 | Takahashi et al. | |
| 6,828,170 B2 | 12/2004 | Roberts et al. | |
| 6,833,565 B2 | 12/2004 | Su et al. | |
| 7,045,375 B1 | 5/2006 | Wu et al. | |
| 7,064,353 B2 | 6/2006 | Bhat | |
| 7,066,623 B2 | 6/2006 | Lee et al. | |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 7,349,163 B2 * | 3/2008 | Angelini et al. | 359/708 |
| 7,441,929 B2 * | 10/2008 | Stefanov et al. | 362/336 |
| 7,473,933 B2 | 1/2009 | Yan | |
| 7,474,474 B2 * | 1/2009 | Angelini et al. | 359/708 |
| 7,670,872 B2 | 3/2010 | Yan | |
| 7,772,609 B2 | 8/2010 | Yan | |
| 7,806,558 B2 * | 10/2010 | Williamson | 362/241 |
| 7,985,000 B2 | 7/2011 | Dong | |
| 2001/0015778 A1 | 8/2001 | Murade | |
| 2002/0015013 A1 | 2/2002 | Ragle | |
| 2002/0079837 A1 | 6/2002 | Okazaki | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 | 7/2003 | Yamanaka et al. | |
| 2003/0227249 A1 | 12/2003 | Mueller et al. | |
| 2003/0230977 A1 | 12/2003 | Epstein | |
| 2004/0004437 A1 | 1/2004 | Shimizu et al. | |
| 2004/0051111 A1 | 3/2004 | Ota et al. | |
| 2004/0079957 A1 | 4/2004 | Andrews et al. | |
| 2004/0102061 A1 | 5/2004 | Watanabe | |
| 2004/0126918 A1 | 7/2004 | Kurahashi et al. | |
| 2004/0173810 A1 | 9/2004 | Lin et al. | |
| 2004/0201025 A1 | 10/2004 | Barnett et al. | |
| 2004/0257496 A1 | 12/2004 | Sonoda | |
| 2005/0035364 A1 | 2/2005 | Sano et al. | |
| 2005/0062140 A1 | 3/2005 | Leung et al. | |
| 2005/0093146 A1 | 5/2005 | Sakano | |
| 2005/0145872 A1 | 7/2005 | Fang et al. | |
| 2005/0179376 A1 | 8/2005 | Fung et al. | |
| 2005/0199900 A1 | 9/2005 | Lin et al. | |
| 2005/0224830 A1 | 10/2005 | Blonder et al. | |
| 2005/0253242 A1 | 11/2005 | Costello et al. | |
| 2005/0270666 A1 | 12/2005 | Loh et al. | |
| 2005/0286131 A1 | 12/2005 | Saxena et al. | |
| 2006/0012299 A1 | 1/2006 | Suehiro et al. | |
| 2006/0063287 A1 | 3/2006 | Andrews | |
| 2006/0082296 A1 | 4/2006 | Chua et al. | |
| 2006/0082679 A1 | 4/2006 | Chua et al. | |
| 2006/0091788 A1 | 5/2006 | Yan | |
| 2006/0097385 A1 | 5/2006 | Negley | |
| 2006/0170332 A1 | 8/2006 | Tamaki et al. | |
| 2006/0284209 A1 | 12/2006 | Kim et al. | |
| 2007/0194341 A1 | 8/2007 | Chang et al. | |
| 2007/0223219 A1 | 9/2007 | Medendorp et al. | |
| 2007/0274098 A1 | 11/2007 | Wheatley et al. | |
| 2007/0278512 A1 | 12/2007 | Loh et al. | |
| 2008/0308825 A1 | 12/2008 | Chakraborty et al. | |
| 2010/0091499 A1 | 4/2010 | Jiang et al. | |
| 2010/0155755 A1 | 6/2010 | Dong | |
| 2010/0259924 A1 | 10/2010 | Dong | |

FOREIGN PATENT DOCUMENTS

| | | |
|---|---|---|
| JP | 2000-349347 | 12/2000 |
| JP | 2001-057445 | 2/2001 |
| JP | 2002-185046 | 6/2002 |
| JP | 2004-241704 | 8/2004 |
| JP | 2004-253404 | 9/2004 |

OTHER PUBLICATIONS

Final Office Action for U.S. Appl. No. 11/036,559, mailed on Jun. 7, 2010, 11 pages.

Kading, O.W., "Thermal Conduction in Metallized Silicon-Dioxide Layers on Silicon," Applied Physics, Sep. 1994, vol. 65, No. 13, pp. 1629-1631.

Official Action for Japanese Patent Application No. 2005-315149, dated Jul. 21, 2009, 3 pages total.

"Solvent Soluble Polyimide with High Transparency and High Tg: HOP-400, 500," Hitachi Cable Review, Aug. 2003, No. 22, p. 78.

Yan, Xiantao, "Two Test Specimens for Determining the Interfacial Fracture Toughness in Flip-Chip Assemblies," Jun. 1998, Transactions of the ASME, vol. 120, pp. 150-155.

Yan, Xiantao, "Analysis Based Design Guidelines for Metal Runner and Passivation Layers in IC Packaging," Delphi Automotive Systems, Analytical Engineering Conference, May 2000, pp. 1-4.

Notice of Allowance for U.S. Appl. No. 12/420,800, mailed on Mar. 22, 2011, 8 pages.

Non-Final Office Action for U.S. Appl. No. 12/344,158, mailed on Jun. 23, 2011, 11 pages.

Non-Final Office Action for U.S. Appl. No. 11/036,559, mailed on Apr. 12, 2011, 12 pages.

Requirement for Restriction/Election for U.S. Appl. No. 12/344,158, mailed on Apr. 4, 2011, 5 pages.

International Search Report and Written Opinion of PCT Application No. PCT/US2009/069070, dated Mar. 1 2010, 9 pages total.

Non-Final Office Action for U.S. Appl. No. 11/036,559, mailed on Aug. 18, 2009, 15 pages.

Non-Final Office Action for U.S. Appl. No. 11/036,559, mailed on Feb. 3, 2009, 8 pages.

Non-Final Office Action for U.S. Appl. No. 11/036,559, mailed on Sep. 16, 2008, 14 pages.

Final Office Action for U.S. Appl. No. 11/036,559, mailed on May 15, 2008, 17 pages.

Requirement for Restriction/Election for U.S. Appl. No. 11/036,559, mailed on Sep. 19, 2007, 11 pages.

Requirement for Restriction/Election for U.S. Appl. No. 11/036,559, mailed on Aug. 30, 2007, 5 pages.

Requirement for Restriction/Election for U.S. Appl. No. 11/036,559, mailed on Jun. 5, 2007, 5 pages.

* cited by examiner

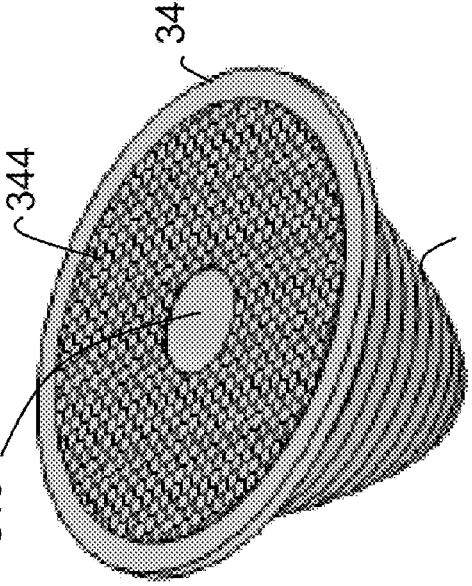
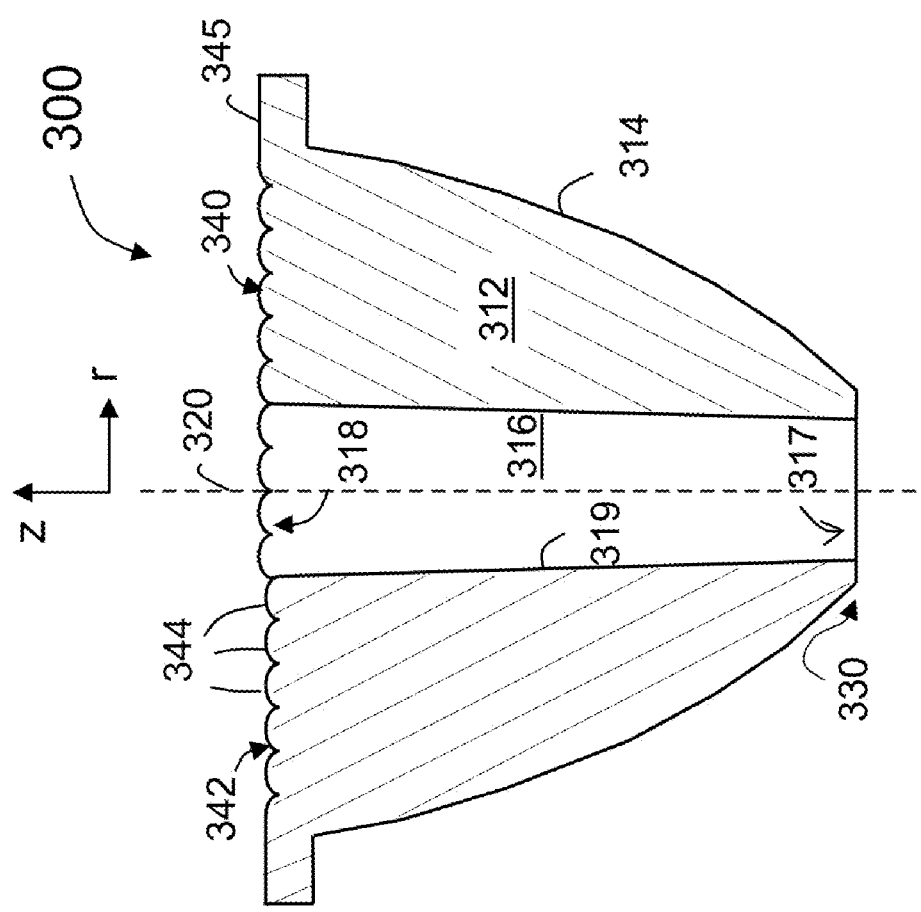
FIG. 3B
FIG. 3A

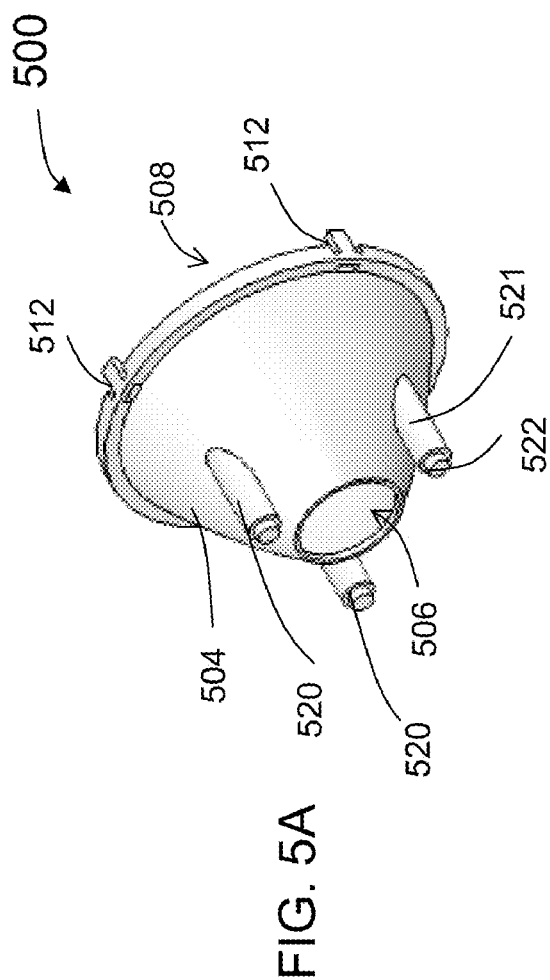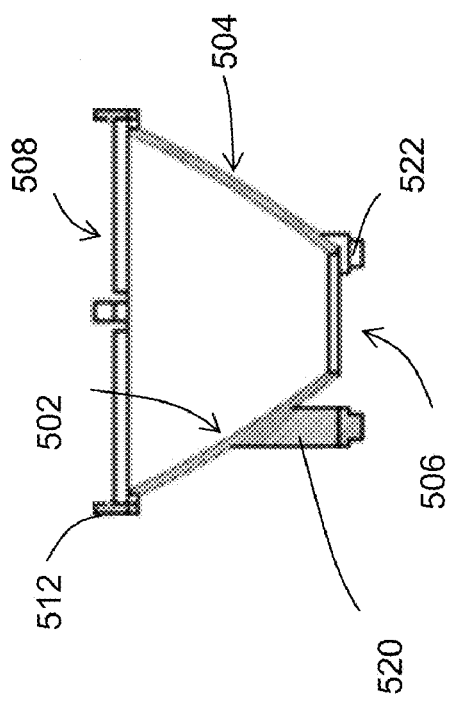
FIG. 5A
FIG. 5B

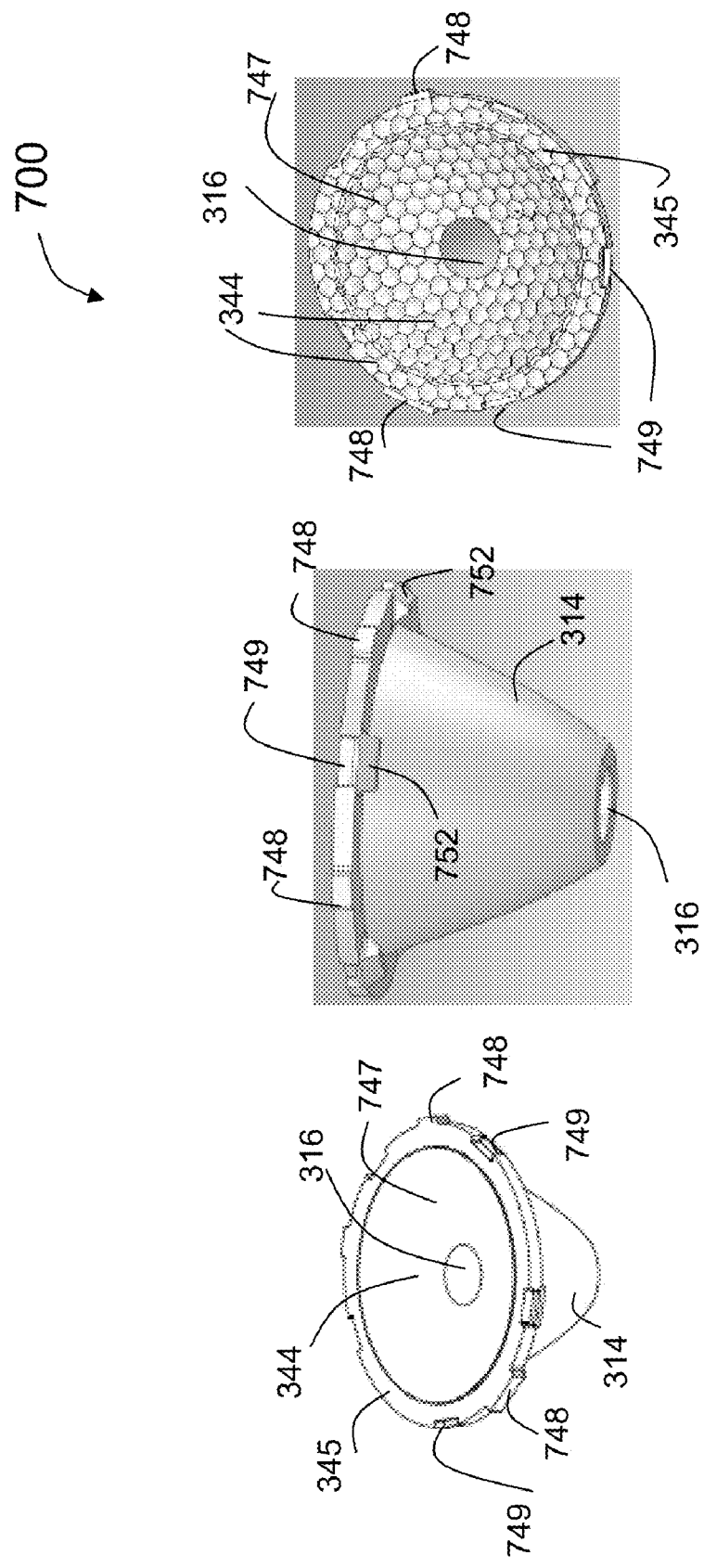

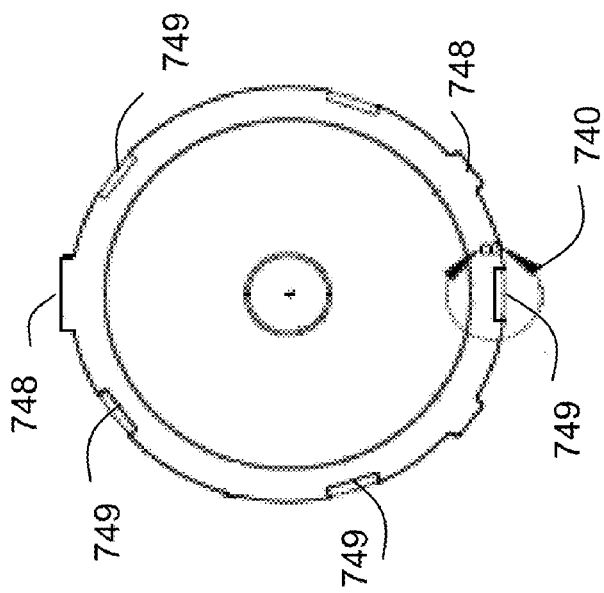
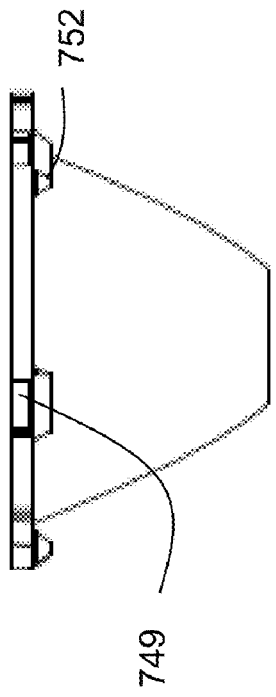
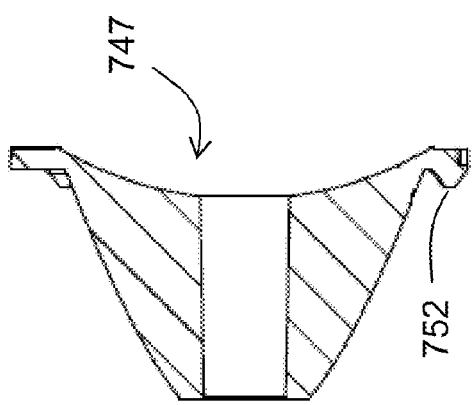
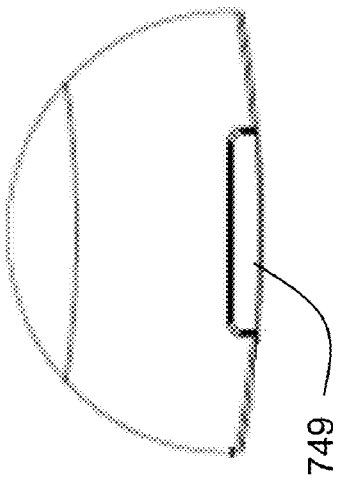
Fig. 7D
Fig. 7E
Fig. 7F
Fig. 7G

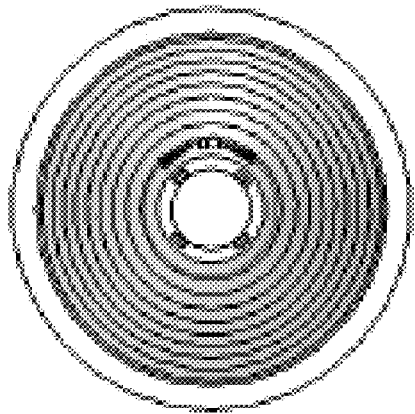
FIG. 11C
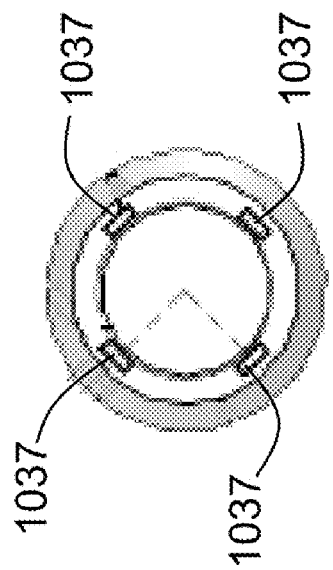
FIG. 11D
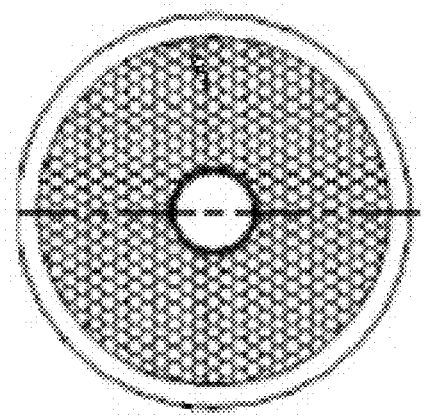
FIG. 11A
FIG. 11B

TOTAL INTERNAL REFLECTION LENS AND MECHANICAL RETENTION AND LOCATING DEVICE

CROSS-REFERENCES TO RELATED APPLICATIONS

This application claims priority to U.S. Provisional Patent Application No. 61/105,407 filed Oct. 14, 2008 and entitled "TOTAL INTERNAL REFLECTION LENS FOR COLOR MIXING," which is commonly owned and incorporated by reference herein. This application is also related to commonly owned U.S. patent application Ser. No. 12/344,158, filed on Dec. 24, 2008 and entitled "LIGHT-EMITTING DIODE WITH LIGHT-CONVERSION LAYER," U.S. Provisional Patent Application Ser. No. 61/167,761, filed of even date herewith and entitled "PACKAGE FOR MULTIPLE LIGHT EMITTING DIODES," and U.S. patent application Ser. No. 12/420,800, filed of even date herewith and entitled "LIGHTING APPARATUS HAVING MULTIPLE LIGHT-EMITTING DIODES WITH INDIVIDUAL LIGHT-CONVERSION LAYERS."

BACKGROUND OF THE INVENTION

The present invention relates generally to lighting apparatus and more particularly to total internal reflection (TIR) lenses and holders for providing centered light output with improved brightness and efficiency.

A light-emitting device usually includes a light source and a package for supporting the light source and directing, focusing, filtering, or enhancing light emitted from the light source. Some examples of light sources include a light-emitting diode (LED), an incandescent lamp, a sapphire crystal light, and a fluorescent lamp.

An LED is a semiconductor device that emits incoherent narrow-spectrum light when electrically biased in the forward direction of the p-n junction. This effect is a form of electroluminescence. The color of the emitted light depends on the composition and condition of the semiconducting material used, and can be infrared, visible or near-ultraviolet. Advantages of LEDs over other lighting sources include compactness, very low weight, low power consumption, simple and inexpensive manufacturing, freedom from burn-out problems, high vibration resistance, and an ability to endure frequent repetitive operations. In addition to having widespread applications for electronic products such as indicator lights and so forth, LEDs also have become an important alternative light source for various applications where incandescent and fluorescent lamps have traditionally predominated.

While LEDs are generally monochromatic, LEDs can also be used to produce white light, for example, using phosphors as light "converters." In a typical LED-based white light producing device, an LED that produces a monochromatic visible light is encapsulated in a material containing a compensatory phosphor. The wavelength of the light emitted from the compensatory phosphor is complementary to the wavelength of the light emitted by the LED such that the wavelengths from the LED and the compensatory phosphor mix together to produce white light. For instance, a blue LED-based white light source produces white light by using a blue monochromatic LED and a phosphor that emits a complementary yellow hue when excited by the blue light. In these devices the amount of the phosphor in the encapsulant is carefully controlled such that a fraction of the blue light is absorbed by the phosphor while the remainder passes unabsorbed. The complementary yellow hue of the light emitted by the phosphor and the unabsorbed blue light mix to produce white light.

Given the importance of LEDs as light sources, particularly LEDs using multiple color elements, there is a need for improved lenses and LED packaging methods and materials. There is a further need for methods and materials that can also reduce light lost at large angles and allow LEDs to produce higher optical performance (Lumens/package) from a smaller package or footprint (Lumens/area), which are critical for many light source applications.

As demand for better lighting devices continues to increase, it would be desirable to provide cost effective LED based lighting apparatus having improved efficiency and brightness.

BRIEF SUMMARY OF THE INVENTION

In various embodiments, the present invention relates to total internal reflection (TIR) lenses and lens holders and related methods for lighting apparatus applications.

According to embodiments of the invention, a lens assembly has a lens and a lens holder, which can be used with a light source to form a lighting apparatus. The lens includes a body member having an outer surface and an interior open channel extending longitudinally through the body member. The body member and the interior open channel are substantially symmetric with respect to an optical axis, and the outer surface is shaped to provide total internal reflection. The body member has a first end region at a first end of the open channel for accommodating a light source and a second end region opposite the first end region. The second end region includes a plurality of refractive surface regions positioned around the open channel.

In various embodiments of the lens assembly, the lens holder has a concave interior surface shaped to accommodate the optical body member of the lens and a convex exterior surface. Depending on the embodiments, the lens holder can have different support and positioning features. In some embodiments, the holder has three or more support members that can fit into registration features in the substrate of the light source. In other embodiments, the holder can have a bottom opening shaped to fit the periphery of the substrate. In some embodiments, the support structures can be built as an integral part of the lens body. In all these embodiments, the support members are adapted for centering the optical body member with respect to the light source and maintaining the light source in the specified position in relation to the optical body member. As a result, brightness and efficiency of the lighting apparatus can be improved.

According to an embodiment of the invention, a lens assembly includes a total-internal-reflection (TIR) lens and a lens holder. The lens includes a body member having an outer surface and an interior open channel extending longitudinally through the body member. The body member and the interior open channel are substantially symmetric with respect to an optical axis, and the outer surface is shaped to provide total internal reflection. The body member has a first end region at a first end of the open channel for accommodating a light source and a second end region opposite the first end region. The second end region includes a plurality of refractive surface regions positioned around the open channel.

In a specific embodiment of the lens, the interior open channel is characterized by a substantially cylindrical sidewall. In an embodiment, the side wall of the interior open channel substantially extends from one end of the interior channel to the other end along a straight path without bending or angles. In some embodiments, the side wall forms a small angle, e.g. 1 degree, with the optical axis. In other words, one end of the interior open channel is slightly larger than the other end. This channel configuration can simplify the manufacturing process, such as a plastic molding process.

In various embodiments of the above lens assembly, the lens holder has a concave interior surface shaped to accommodate the optical body member of the lens and a convex exterior surface. The holder has a first opening disposed to surround the first opening of the optical body member and a second opening opposite the first opening, and the optical body member is insertable into the holder through the second opening. In an embodiment, the holder has three or more support members extending from the exterior surface toward the first opening. The support members are adapted for centering the optical body member with respect to the light source and maintaining the light source in the specified position in relation to the optical body member. In some embodiments, the holder also has one or more clips in an upper rim region thereof for retaining the optical body member.

In some embodiments, a lighting apparatus includes the lens assembly as described above and a light source, for example, one or more light-emitting-diodes (LEDs). In some embodiments, the LEDs may be disposed on a substrate that has a plurality of registration features. In an embodiment, the support members of the holder are configured to fit into the registration features in the substrate. In an embodiment, the light source has 12 or more light-emitting diodes. In some embodiments, the light source has one or more light-emitting diodes, each of which has a wavelength-shifting material and being adapted to produce white light.

According to another embodiment, the present invention provides a lighting apparatus that includes a lens assembly and a light source. The lens assembly has a lens and a holder. The lens has an optical body member having a first end, a second end opposite the first end, and an outer surface. The optical body member is substantially symmetric with respect to an optical axis, and the outer surface being shaped to provide total internal reflection for the light from a source having a specified position in relation to the first end. The optical body member also has an interior open channel extending longitudinally from the first end to the second end thereof, the interior open channel being substantially symmetric with respect to the optical axis. The interior open channel has a first opening at the first end for accommodating a light source and a second opening at the second end. The optical body member also has a plurality of curved refractive surface regions disposed in the second end thereof and around the second opening of the interior open channel. In a specific embodiment, the second end has a peripheral flange that is free of curved refractive surface regions, and has one or more index regions and one or more notches formed therein. In an embodiment, the optical body member has a concave surface at the second end, the plurality of curved refractive surface regions being formed in the concave surface. In some embodiments, the multiple refractive surface regions form hexagonal microlenses, each of which has a curvature and a lateral dimension selected to provide a predetermined beam width.

In the above embodiment, the holder is a substantially cylindrical support member having a hollow interior region shaped to accommodate the optical body member. The holder also has a top rim region having one or more slots for receiving the index regions of the optical body member and one or more snap clips for fitting to the notches of the peripheral flange region of the optical body member and thereby retaining the optical body member. Thus, the holder is adapted for centering the optical body member and maintaining the light source at a predetermined position with respect to the optical body member. In an embodiment, the light source has one or more light-emitting-diodes disposed on a substrate that includes a plurality of notches. The holder has one or more cut outs in a side wall, the cut outs configured to allow passage of electrical connectors of the light source.

In another embodiment of the present invention, a lighting apparatus includes a light source having a plurality of light-emitting-diodes disposed on a substrate and a lens having protrusions at one end for fitting into the substrate. The lens has an optical body member including a first end, a second end opposite the first end, and an outer surface. The optical body member is substantially symmetric with respect to an optical axis, and the outer surface is shaped to provide total internal reflection for light from a source having a specified position in relation to the first end. The optical body member also has an interior open channel extending longitudinally from the first end to the second end thereof, the interior open channel being substantially symmetric with respect to the optical axis. The interior open channel has a first opening at the first end for accommodating a light source and a second opening at the second end. The optical body member further has a plurality of refractive surface regions disposed in the second end thereof and around the second opening of the interior open channel. Furthermore, a plurality of protrusions extend from the first end of the optical body member and are disposed circumferentially around the first opening of the interior open channel. The protrusions are arranged to center the optical body member and to maintain the optical body member at a predetermined position with respect to the light source.

In some embodiments, the lighting apparatus described above includes a light source that has four or more light-emitting diodes (LEDs). In an embodiment each of the LEDs has a wavelength-shifting material and is adapted to produce white light.

A further understanding of the nature and advantages of the present invention may be realized by reference to the remaining portions of the specification and the drawings.

BRIEF DESCRIPTION OF THE DRAWINGS

FIG. 3A is a simplified cross-sectional view diagram illustrating a lens according to an embodiment of the present invention;

FIG. 3B a simplified perspective view of a lens according to another embodiment of the present invention;

FIGS. 5A-5B are simplified diagrams illustrating a perspective view and a cross-sectional view, respectively, of a lens holder according to an embodiment of the present invention;

FIGS. 7A and 7B are simplified perspective view and top view of a TIR lens, respectively, according to another embodiment of the present invention;

FIGS. 7C-7G are various additional views of the lens of FIG. 7A according to an embodiment of the present invention;

FIGS. 11A-11D are various additional views of the lens of FIGS. 10A-10B.

DETAILED DESCRIPTION OF THE INVENTION

Embodiments of the present invention relate to total internal reflection lenses and lens holders forming light apparatus with improved brightness and efficiency.

Although finding increasingly wider applications, conventional devices suffer from many limitations. For example, the color balance of the white light or mixed light from multiple colored light sources can vary depending on the position of the light source or an angle from which the light is viewed, which results in a non-uniform color distribution. Attempts have been made using special mixing lenses to compensate for the non-uniformity of the color distribution. However, while the variation may be reduced, the color still varies noticeably depending on the angle of the emitted illumination, or the angle from which the illumination is received or viewed. Such color non-uniformity can negatively affect designs for light apparatus such as spot lights and other general lighting applications, and color display technologies such as active matrix thin film transistor liquid crystal displays (TFTLCDs) in applications such as consumer computer and television monitors, projection TVs, and large advertising displays. One solution to the problem of color variation is to use a secondary lens with a light mixing design on the light emitting device. Unfortunately, the secondary lens generally causes a 40% to 50% reduction in light intensity output by the light emitting device.

In various embodiments, the present invention provides lighting apparatus with total internal reflection (TIR) lenses and lens holders for providing centered light output with improved brightness and efficiency.

Figure 1B:
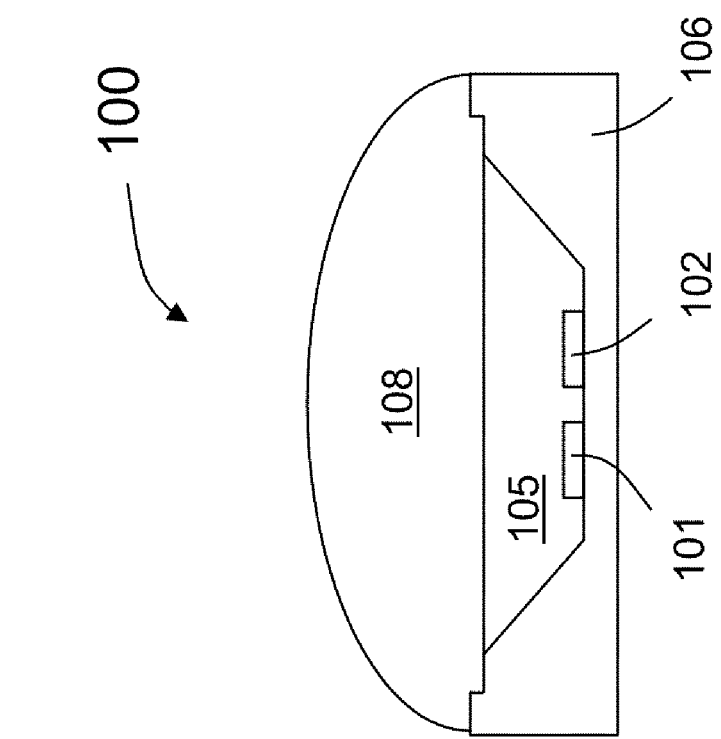
FIGS. 1A and 1B are simplified top view and cross-sectional view, respectively, of an LED-based lighting device having multiple LED dice.
Figure 1A:
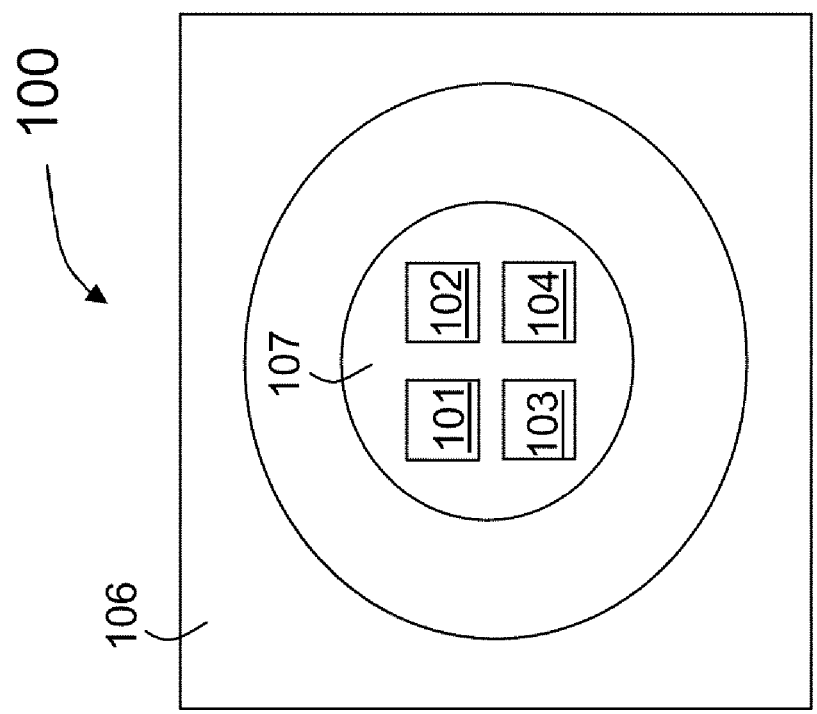

FIGS. 1A and 1B are simplified top and cross-sectional side views of an LED-based lighting device 100 having multiple LED dice. As shown in FIG. 1A, four LED dice 101-104 are disposed in a recess 107 on substrate 106. As shown in FIG. 1B, a light-converting material 105, such as phosphor, is deposited over the LED dice. For example, for a white light device, LED dice 101-104 may be blue LEDs, and light-converting material 105 may be a yellow phosphor. Additionally, a primary lens 108 may be disposed over the LEDs.

Figure 2:
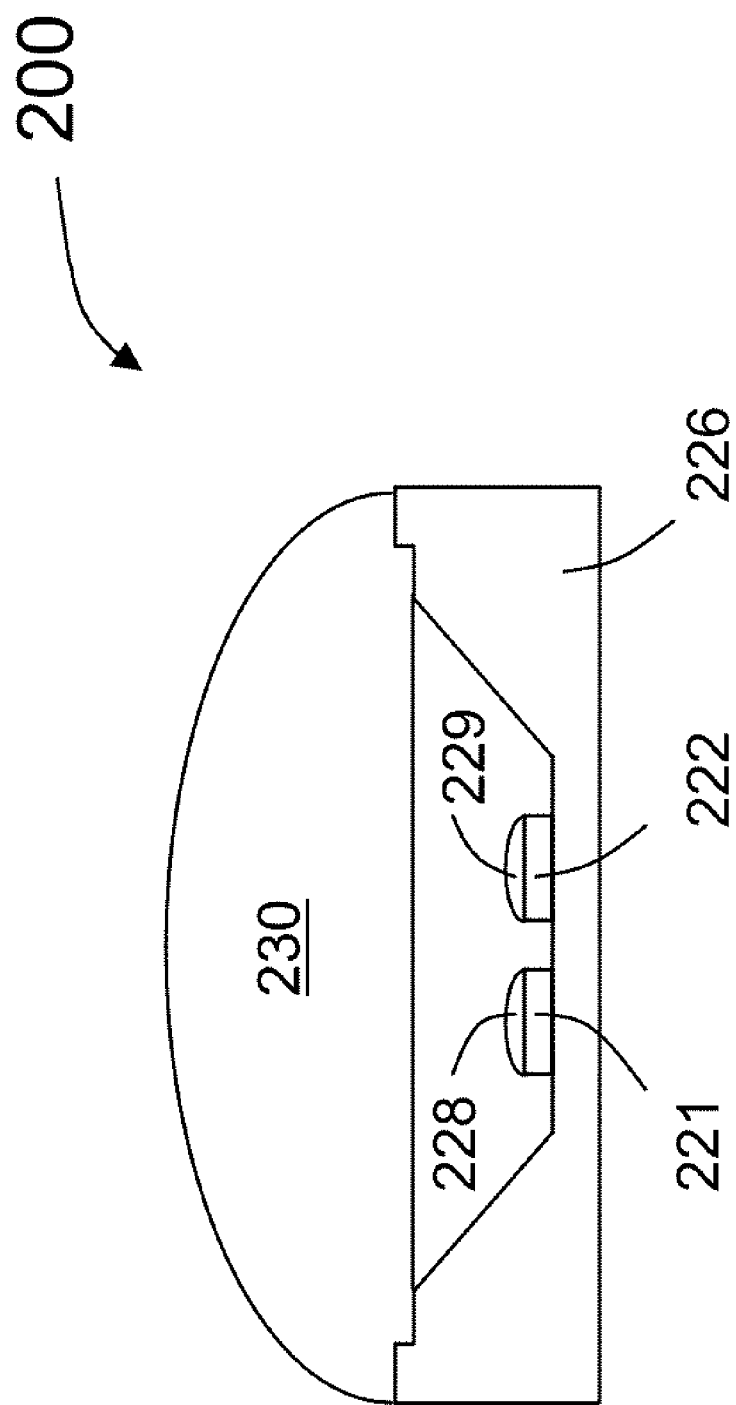
FIG. 2 shows an alternative LED-based lighting device.

FIG. 2 shows another LED-based lighting device 200 having multiple LED dice, of which LED dice 221 and 222 are shown. Each LED die has a light-converting material, e.g., 228 and 229, deposited thereon. Lighting device 200 also has a primary lens 230. The light-converting material, containing a wavelength-shifting material such as phosphor, is deposited over the top surface of each LED, and the side surfaces of the LED are substantially free of the phosphor-containing material. This deposition process may be performed using a syringe or a needle for each of the LEDs. Further details of methods for depositing phosphor over individual LED dice can be found, for example, in U.S. patent application Ser. No. 12/344,158, filed on Dec. 24, 2008 and entitled "LIGHT-EMITTING DIODE WITH LIGHT-CONVERSION LAYER."

FIG. 3A is a simplified cross-sectional view diagram illustrating a lens a according to an embodiment of the present invention. In embodiments of the present invention, lens 300 is configured to provide collimated light with uniform color output. Depending on the embodiments, lens 300 can be made of different material, e.g. glass or transparent plastic such as PMMA (Polymethylmethacrylate). Of course, other material having suitable refractive index and transparency can also be used.

In the embodiment of FIG. 3A, lens 300 has a body member 312, which has an outer surface region 314 and an interior open channel 316 that extends longitudinally through body member 312. Optical body member 312 and interior open channel 316 are substantially symmetric with respect to optical axis 320. In an embodiment, the outer surface region 314 is shaped to provide total internal reflection of light from a light source positioned below region 330.

As shown in FIG. 3A, lens 300 has a first end region 330 at a first end 317 of open channel 316 for accommodating a light source, such as lighting device 200 of FIG. 2 or lighting device 100 of FIG. 1. Lens 300 also has a second end region 340 at a second end 318 of open channel 316 opposite the first end region 330. The second end region 340 has a circular surface 342 that includes a plurality of refractive regions 344 (e.g., microlenses) positioned around second end 318 of open channel 316. In some embodiments, lens 300 also has flange 345 at the edge of the second end region 340.

In some embodiments, interior open channel 316 is characterized by a substantially cylindrical sidewall 319. In certain embodiments, the cylindrical sidewall surface extends from the first end 317 to the second end 318 of open channel 316 without bending. According to a specific embodiment, the substantially straight side wall can provide more reflection and better mixing of light in the open channel. Therefore in some embodiments, it is desirable for the open channel side wall to have no bending or angles. In some embodiments, long and narrow open channels can provide better light reflection and mixing. The substantially cylindrical side wall 319 can be slightly tapered (e.g., 1 degree or less, or 5 degrees or less) such that the opening at first end 317 is slightly smaller than the opening at the second end 318.

In certain embodiments, the interior open channel 316 tends to collimate light in the center region. The total-internal-reflection surface 314 is adapted to prevent light loss, and the multiple refractive surface regions 344 operate to distribute light uniformly. In some embodiments, the multiple refractive surface regions 344 in end region 340 of lens 300 can have hexagon or honeycomb shapes. The size of the hexagon in the honeycomb pattern can be optimized experimentally, based on a desired output beam width.

As described above, in certain embodiments, one end of the open channel can be slightly larger than the other. For example, the cross-sectional profile of the cylindrical sidewall 319 can form a small angle, e.g., 1 degree, relative to optical axis 320. The slightly expanding open channel can simplify the process of making the lens. For example, the lens can be manufactured using a plastic molding process, and the slightly slanted sidewall can facilitate the separation of the lens and the mold.

According to embodiments of the present invention, the outer surface 314 of lens 300 is shaped to provide total internal reflection of light originating from a group of LEDs placed in a particular position below opening 317. In some embodiments, the shape of outer surface 314 can be described by the following equation.

$$z = \frac{cr^2}{1 + \sqrt{1 - (1+k)c^2 r^2}} \quad (1)$$

where z denotes the longitudinal coordinate (z=0 is the plane of first end region 330) and r is the radius measured from the optical axis 320, as shown by the coordinates in the upper portion of FIG. 3A. Curvature parameters k and c can be varied, e.g., based on a particular configuration of LEDs, to optimize total internal reflection.

Light from the source entering lens 300 from first end 330 that strikes TIR surface 314 is internally reflected and, therefore, is largely prevented from escaping out the side of the lens. However, the efficiency of the TIR surface need not be 100%, as absorption by the lens body and surface leakage can reduce the efficiency of the lens. In some embodiments, lens 300 can have an efficiency of about 70% or higher. In a specific embodiment, the efficiency of the TIR lens is about 80-85%.

FIG. 3B a simplified perspective view of lens 350 which is similar to lens 300 in FIG. 3A. Therefore, similar or identical features are labeled with the same reference numbers as in FIG. 3A, such as TIR surface 314, flange 345, interior open channel 316, and refractive surface regions 344. In this particular embodiment, the refractive surface regions 344 form microlenses that are hexagonal in shape and are arranged in a honeycomb pattern.

Figure 4B:
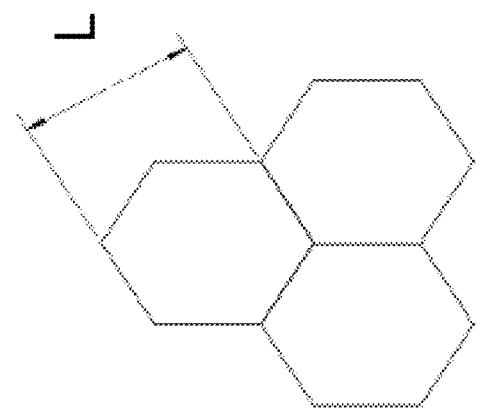
FIG. 4B is a simplified cross-sectional view diagram illustrating a portions of the multiple refractive surfaces in the lens of FIG. 4A.
Figure 4C:
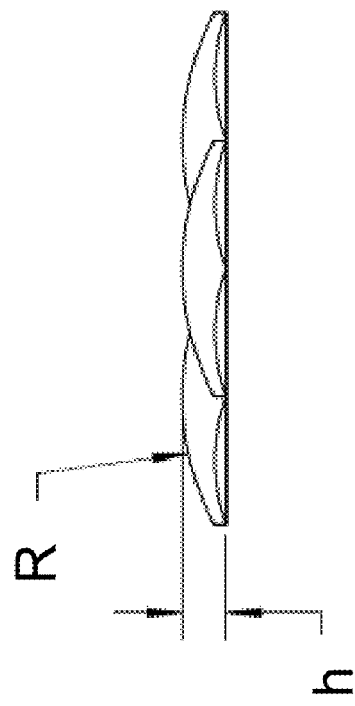
FIG. 4C is a magnified top view of the refractive surfaces in FIG. 4A.
Figure 4A:
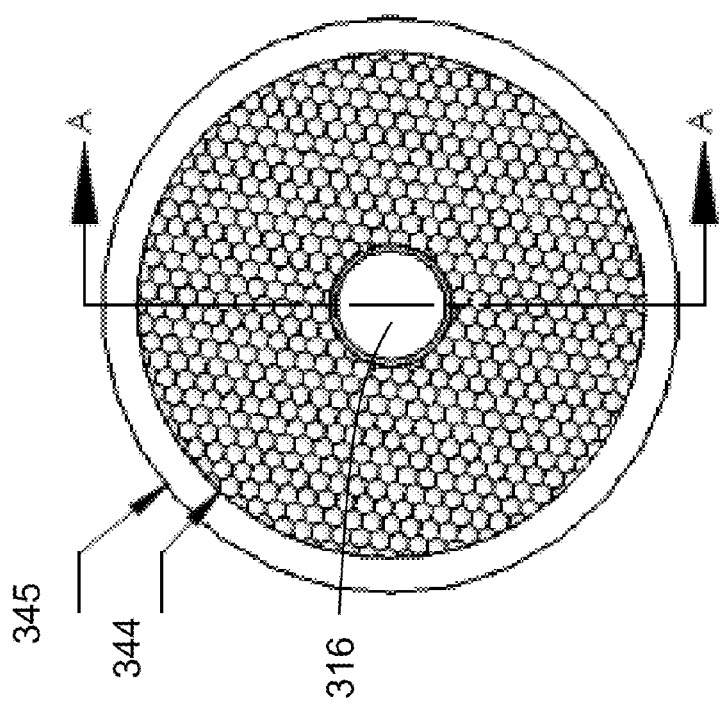
FIG. 4A is a simplified top view of the lens of FIG. 3B.

FIG. 4A is a simplified top view of lens 350 of FIG. 3B, showing flange 345, interior open channel 316, and microlenses 344. FIG. 4B shows a cross-sectional view of a portion of the microlenses 344, in which a microlens is shown to have a radius R and a height h. FIG. 4C is a magnified top view of the microlenses, which are shown as hexagonal shaped regions having a lateral dimensional L. According to embodiments of the present invention, the microlenses can be made to provide different beam widths by varying the parameters such as R, h, and L. In various embodiments, lenses are configured to provide wide, medium, or narrow beam widths to suit different applications. For example, in one embodiment, a configuration with R=3.0 mm, h=0.1 mm, and L=1.33 mm is used for a narrow beam having a beam width of about 12-17 degrees; R=2.0 mm, h=0.2 mm, and L=1.51 mm is used for a medium beam having a beam width of about 20-24 degrees; and R=3.0 mm, h=0.55 mm, and L=3.0 mm is used for a wide beam having a beam width of about 25-30 degrees. It should be noted that the selection of the values of the (R, h, L) parameters for shaping a beam width can be largely independent of the values of k and c in Equation (1).

FIGS. 5A-5B are simplified diagrams illustrating a perspective view and a cross-sectional view, respectively, of a lens holder according to an embodiment of the present invention. As shown, holder 500 has a concave interior surface 502 (shown in FIG. 5B) shaped to accommodate the optical body member of a lens, such as lens 300 of FIG. 3A or lens 350 of FIG. 3B. Holder 500 also has a convex exterior surface 504. In an embodiment of the invention, holder 500 is configured to fit lens 300 of FIG. 3A, which has first opening 317 and second opening 318. In this case, holder 500 has a first opening 506 disposed to surround the first opening 317 of the lens and a second opening 508 opposite the first opening, and the optical body member of the lens is insertable into the holder through second opening 508.

In an embodiment, holder 500 has three or more support members 520 extending from the exterior surface 504 toward first opening 506. In an embodiment, holder 500 also has one or more clips 512 in an upper rim region thereof for securing the optical body member of the lens. In a specific embodiment, each of the support members 520 of the holder includes an elongated body having two sections with two different lateral dimensions, shown as 521 and 522, respectively, in FIGS. 5A and 5B. Here, support members 520 are adapted for centering the optical body member of the lens with respect to a light source in a lighting apparatus and maintaining the light source in the specified position in relation to the optical body member. For example, the light source may be an LED package with a substrate that has registration features (e.g. grooves, slots, notches, and indentations) and sections 522 of support members 520 may be shaped to fit into these registration features. In another embodiment, registration features on an LED package substrate may include raised features (e.g., bumps), and sections 522 may fit over these features (for example, section 522 may be hollow at the bottom end).

Holder 500 can be made using a suitable material. In an embodiment, holder 500 is made of a plastic material using a molding process. In a specific embodiment, the internal surface 502 can be a reflective surface with, e.g., a metallic coating or reflective paint, to reflect light escaped from the side surface of the TIR lens. In other embodiment, the holder can also be made of a metal containing material.

Figure 6:
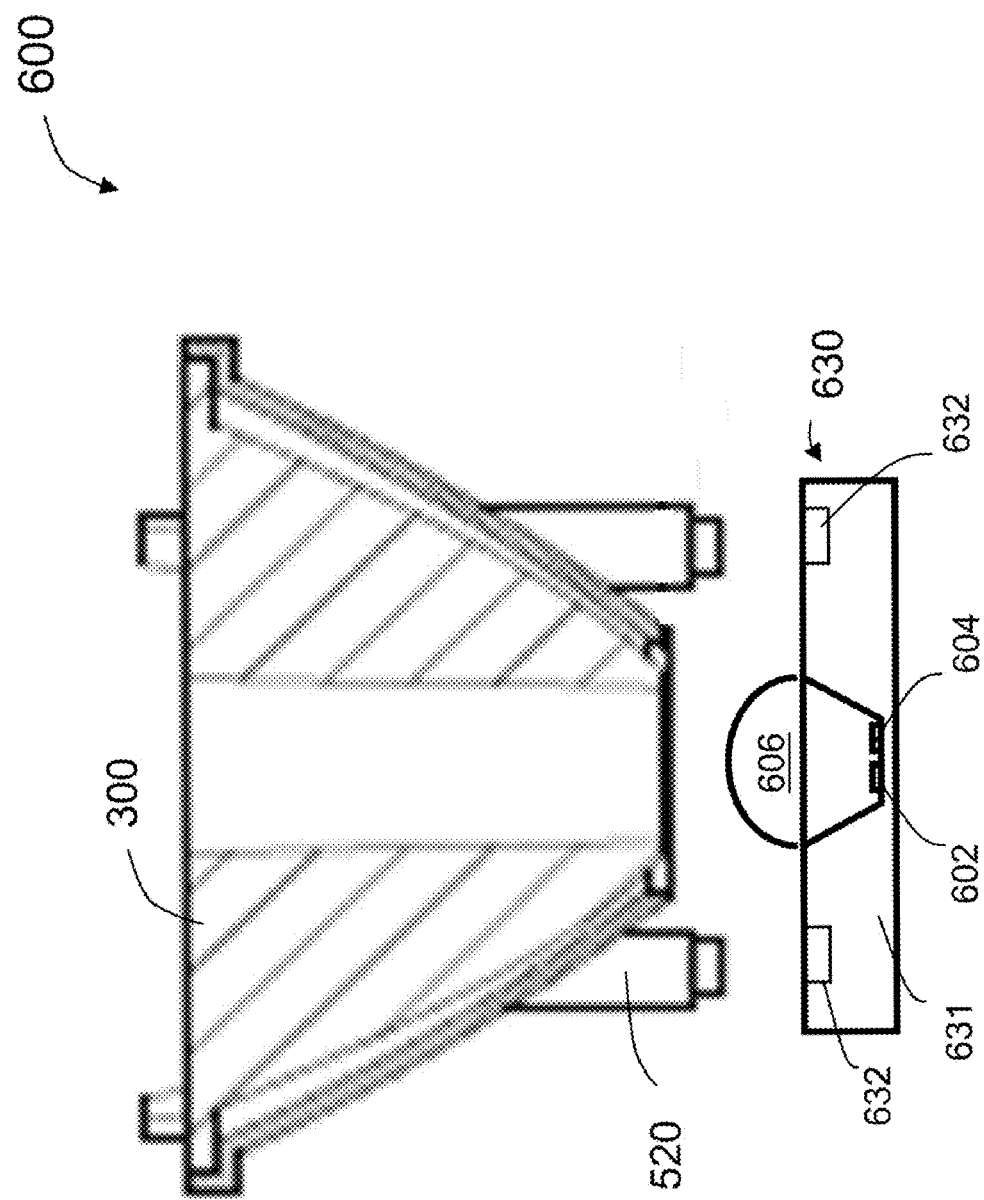
FIG. 6 is a simplified cross-sectional view diagram illustrating a lighting apparatus according to an embodiment of the present invention.

FIG. 6 is a simplified cross-sectional view diagram illustrating a lighting apparatus according to an embodiment of the present invention. As shown, lighting apparatus 600 includes lens 300 or 350 as described above in connection with FIGS. 3A-3B and 4A-4C, and lens holder 500 as described above in connection with FIGS. 5A and 5B, and light source 630.

Depending on the embodiments, lighting apparatus 600 can employ incandescent, sapphire crystal, fluorescent, or LED light sources that operate over the range of wavelengths from ultraviolet (UV) to Infrared (IR) which covers the range from about 200 to 2000 nanometers.

In some embodiments, light source 630 includes four LEDs in a configuration similar to that described above in connection with FIG. 2. In FIG. 6, two of the four LEDs 602 and 604 are shown disposed on a substrate 631 that includes notches 632. In this case, each support member 520 of holder 500 is shaped to fit into one of the notches 632 in substrate 631. Additionally, light source 630 also includes a primary lens 606 overlying the LEDs.

In a specific embodiment of lighting apparatus 600, lens 300 is optimized for a light source having 12 LED dice in a package that also includes a substrate and a primary lens. In this embodiment, lens 300 has a height of about 25 mm and a diameter of about 45 mm with a flange region about 2.75 mm wide. In one example, the microlenses have dimensions R=3.0 mm, h=0.1 mm, and L=1.33 mm for a narrow beam angle, R=2.0 mm, h=0.2 mm, and L=1.51 mm for a medium beam angle, and R=3.0 mm, h=0.55 mm, and L=3.0 mm for a wide beam angle. Additionally, in this embodiment, holder 500 has three clips 512.

In the examples described above, lighting apparatus 600 has four LEDs. However, any number of LEDs may be used in a lighting apparatus depending on the embodiments. For example, a lighting apparatus can have 1, 2, 4, 8, 12-16, or more LEDs, depending on the application.

FIGS. 7A and 7B are simplified perspective views of a TIR lens 700 according to another embodiment of the present invention. FIG. 7C is a simplified top view of a TIR lens according to yet another embodiment of the invention. Lens 700 is similar to lens 300 in FIG. 3A, and similar or identical features are labeled with the same reference numbers as in FIG. 3A, such as TIR surface 314, flange 345, interior open channel 316, and top surface with microlenses 344. In an embodiment, lens 700 has a concave top surface 747 at the second end of the optical body. In this case, the microlenses 344 (e.g., as described above with reference to FIGS. 4A-4C) are formed in the concave surface. In the embodiment of FIG. 7C, microlenses 344 are also formed in peripheral flange region 345. In some embodiments, peripheral flange 345 is free of microlenses. Depending on the embodiment, peripheral flange 345 can have one or more indexing regions, or tabs, 748 and one or more notches 749 formed therein for fitting to a lens holder. In some embodiments, a protruding alignment feature 752 is formed below each notch.

FIGS. 7D-7G are various additional views of lens 700 of FIG. 7A according to an embodiment of the present invention. FIG. 7D is a cross-sectional view of lens 700 of FIG. 7, in which the concave surface is labeled 747 and the protruding alignment feature is labeled 752. FIG. 7E is a top view of lens 700, which shows index regions 748 and notches 749 for fitting with a holder. FIG. 7F is a magnified view of the portion of FIG. 7C inside circle 740 showing notch 749 in more detail. FIG. 7G is a side view of lens 700 showing notch 749 and protruding alignment feature is labeled 752, among other features.

In a specific embodiment, lens 700 is optimized for a light source having a single LED die in a package that also includes a substrate and a primary lens. In this embodiment, lens 700 has a height of about 14 mm and a diameter of about 25 mm with a flange region about 2 mm wide. In one example, the microlenses have dimensions R=3.0 mm, h=0.1 mm, and L=1.33 mm for a narrow beam angle, R=2.0 mm, h=0.2 mm, and L=1.51 mm for a medium beam angle, and R=3.0 mm, h=0.55 mm, and L=3.0 mm for a wide beam angle. Additionally, in this embodiment, lens 700 has three indexing regions, each having a width of about 5 mm, and five notches, each having a width of about 2.0 mm and a height of about 0.25 mm. In another embodiment, lens 700 has two indexing regions and three notches.

Figure 8B:
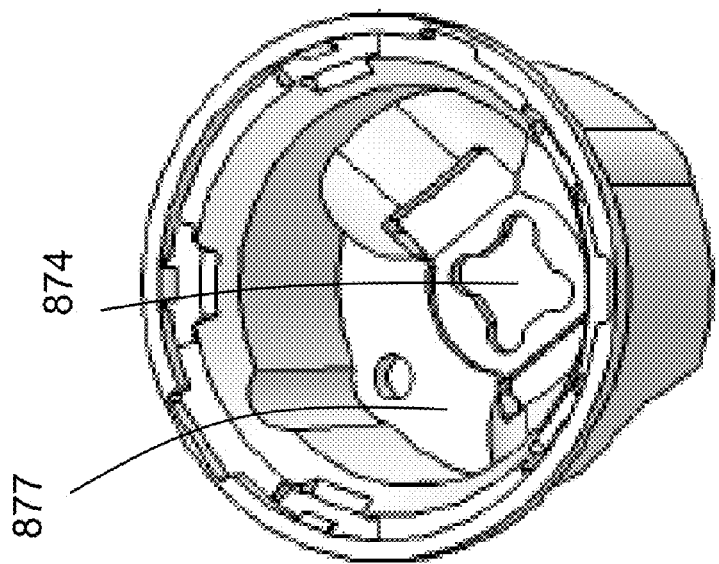
FIGS. 8A and 8B are simplified perspective views of a lens holder according to another embodiment of the present invention.
Figure 8A:
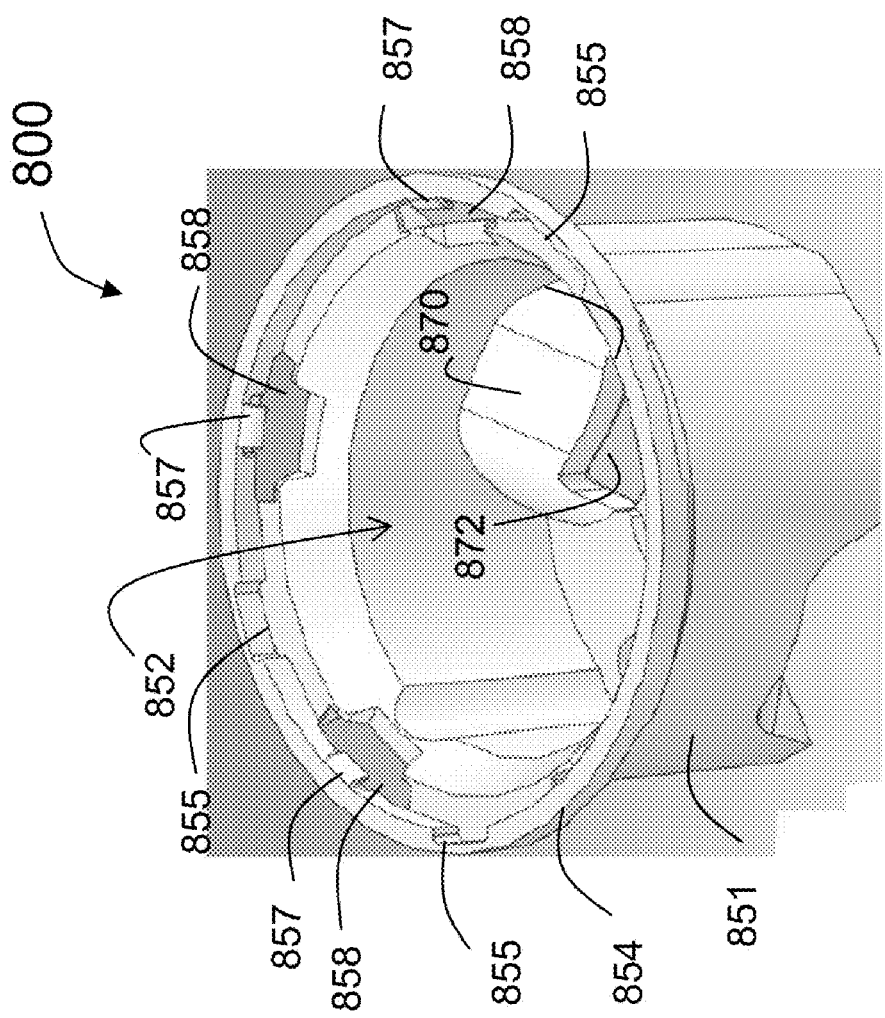

FIG. 8A is a simplified perspective view of a lens holder 800 according to another embodiment of the present invention. As shown, lens holder 800 has a substantially cylindrical body 851 with a hollow interior region 852 shaped to accommodate the optical body member of lens 700. Holder 800 also has a top rim region 854 with one or more slots 855 for receiving the indexing regions 748 of lens 700. One or more snap clips 857 and associated cutouts 858 are shaped to fit to notches 749 and protruding alignment features 752 of lens 700. FIG. 8B is another perspective view of holder 800 from a slightly different view angle, showing opening 874 in the bottom plate 877. Thus, holder 800 is configured to secure lens 700 and center the lens and maintain a light source (not shown) at a predetermined position with respect to the optical body member. In an embodiment, holder 800 also has two side walls 870 at a slanted angle with respect to the cylindrical body, each side wall having a clearance 872 for allowing connectors from the LED device (not shown) at the bottom of the holder to extend outside the holder.

Figure 8E:
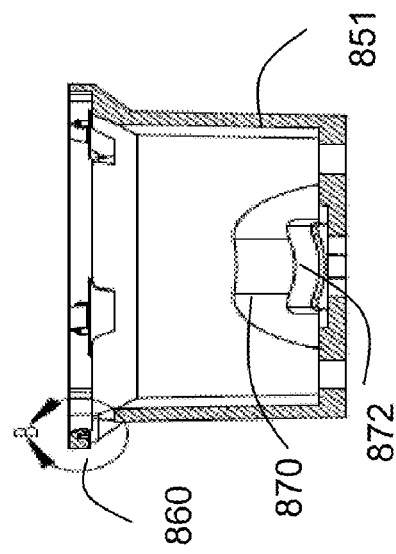
FIGS. 8C-8I are various additional views of the lens holder of FIG. 8A according to an embodiment of the present invention.
Figure 8F:
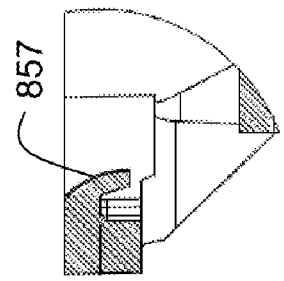
Figure 8C:
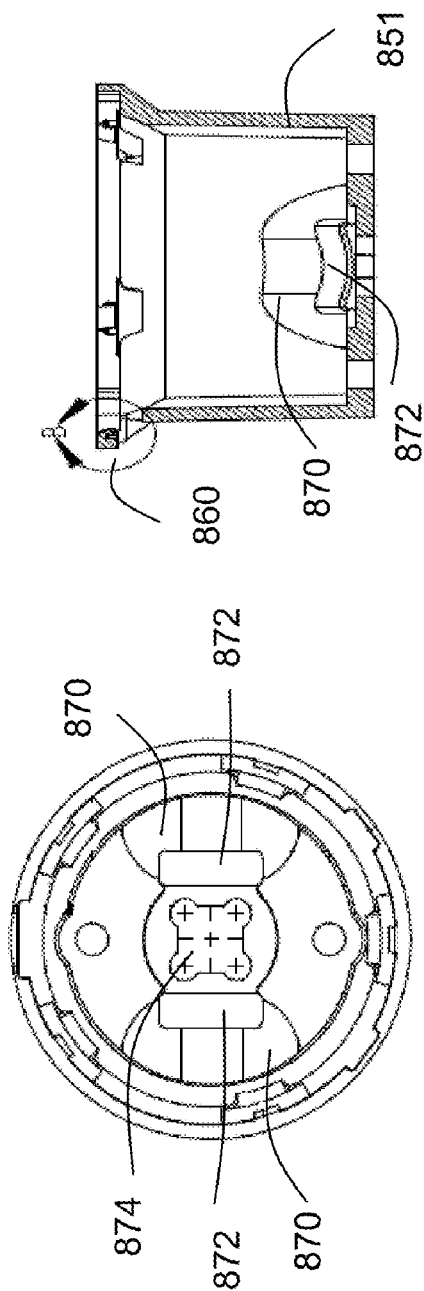
Figure 8D:
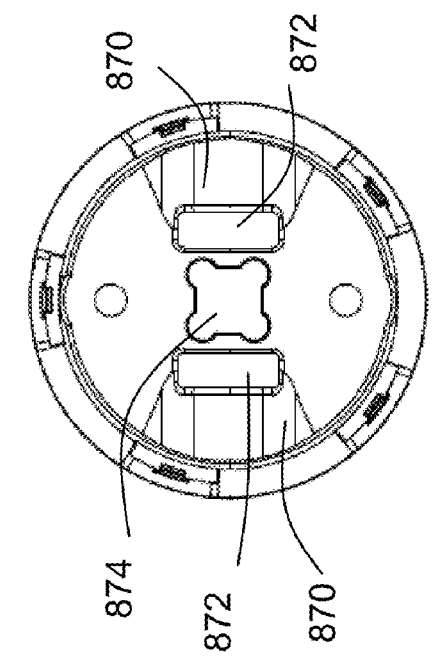

FIGS. 8C-8I are various additional views of lens holder 800 of FIG. 8A according to an embodiment of the present invention. FIG. 8C is a top view of lens holder 800 showing various structural details, e.g., slanted side wall 870, clearance 872, and bottom opening 874. FIG. 8D is a bottom view of holder 800 showing, among other features, slanted side wall 870, clearance 872, and bottom opening 874. In particular, bottom opening 874 in the holder is shaped for securing an LED-based light source.

In a specific embodiment, lens 700 and holder 800 are optimized for a light source having a single LED in a package that includes a substrate and a primary lens. The bottom opening 874 of holder 800 is shaped to fit the peripheral contour of that package, and the height of holder 800 is selected so that the primary lens of the LED package fits into the bottom opening of lens 700 to allow effective capture of the light from the LED dice. In this embodiment, holder 800 has a height of about 15 mm and a diameter of about 27 mm. In this embodiment, older 800 also has five snap clips and two slots for holding lens 700. In another embodiment, holder 800 has three snap clips and two slots for holding lens 700.

Figure 8I:
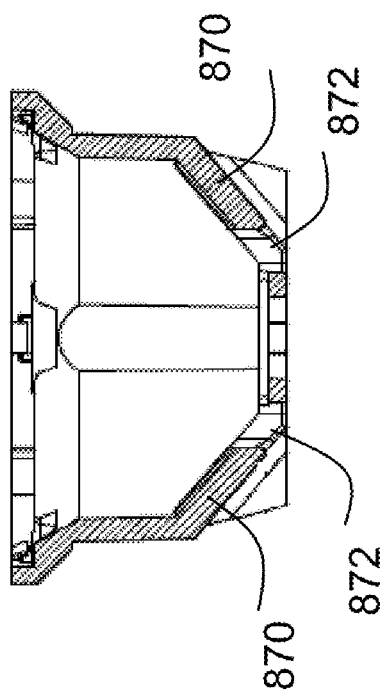
Figure 8G:
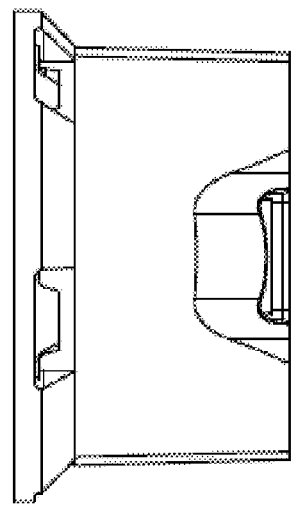
Figure 8H:
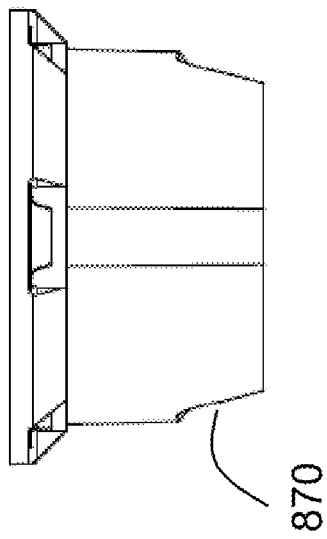

FIG. 8E is a side view of holder 800 showing the cylindrical holder body 851, slanted sidewall 870, and clearance 872 in the center of the holder. FIG. 8F is a magnified view of circle 860 in FIG. 8E showing details of clip 857. FIGS. 8G and 8H are two side views of holder 800 from two different viewing angles. FIG. 8I is another cross-sectional view of holder 800, showing the slanted side walls 870 and clearance 872.

Figure 9A:
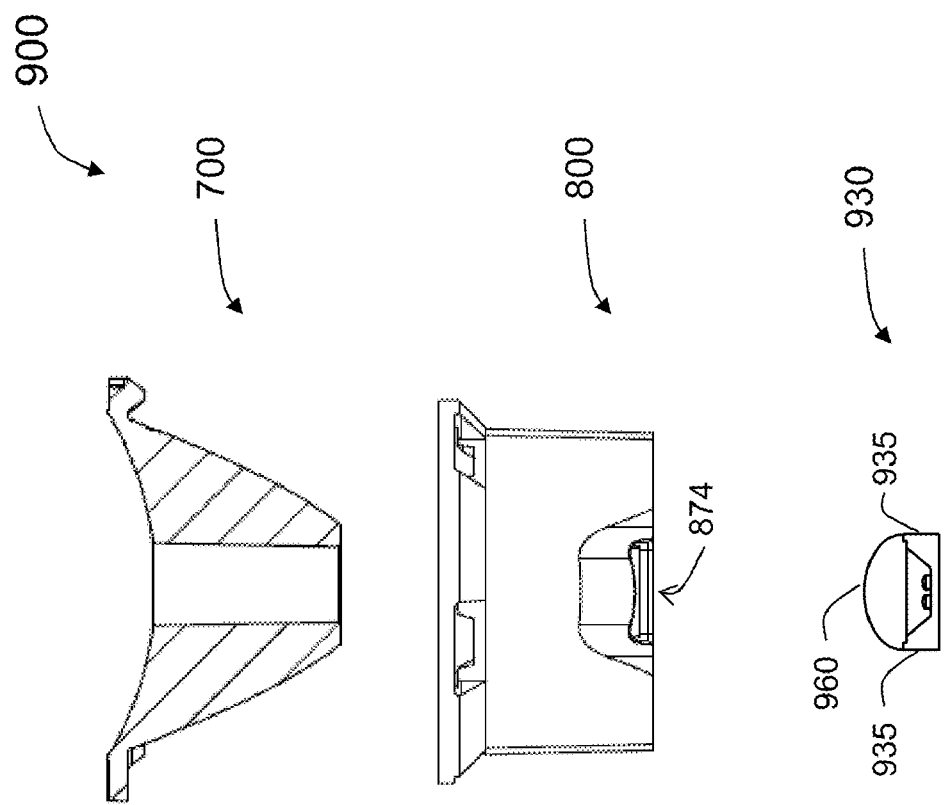
FIG. 9A is a simplified cross-sectional view of a lighting apparatus according to another embodiment of the present invention.

FIG. 9A is a simplified cross-sectional view of a lighting apparatus 900 according to another embodiment of the present invention. As shown, lighting apparatus 900 includes lens 700 of FIGS. 7A-7E, holder 800 of FIGS. 8A-8G, and a light source 930. In an example, light source 930 can be similar to the LED-based light source 200 described above in connection with FIG. 2. As shown in FIG. 9A, light source 930 has a primary lens 960. In a specific embodiment, lighting apparatus 900 may have only one LED. However, in other embodiments, two or more LEDs can also be used.

Figure 9B:
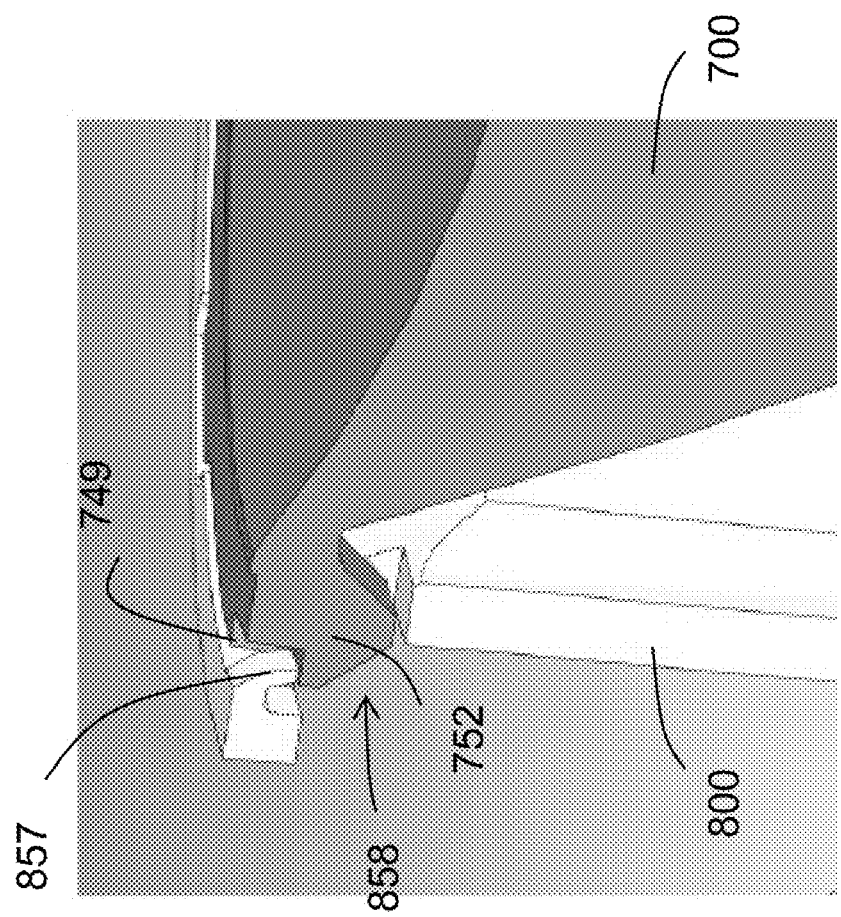
FIG. 9B is a 3-dimensional view of partial cross sections of the lens and holder in the apparatus of FIG. 9A showing the lens and the holder in a locked position.

When lens 700 is inserted into holder 800, index regions 748 align with slots 855, and notches 749 fit into snap clips 857. FIG. 9B is a 3-dimensional view of partial cross sections of the lens and holder in the apparatus of FIG. 9A showing the lens and the holder in a locked position. As shown, notch 749 and protruding alignment feature 752 of lens 700 are shaped to fit securely with clip 857 and cutout 858 of holder 800. In FIG. 9A, the bottom opening 874 of holder 800 is shaped (shown in FIG. 8B) to fit the peripheral contour 935 of light source 930. Thus, the holder is adapted for centering the lens and maintaining the light source at a predetermined position with respect to the lens.

Figure 10B:
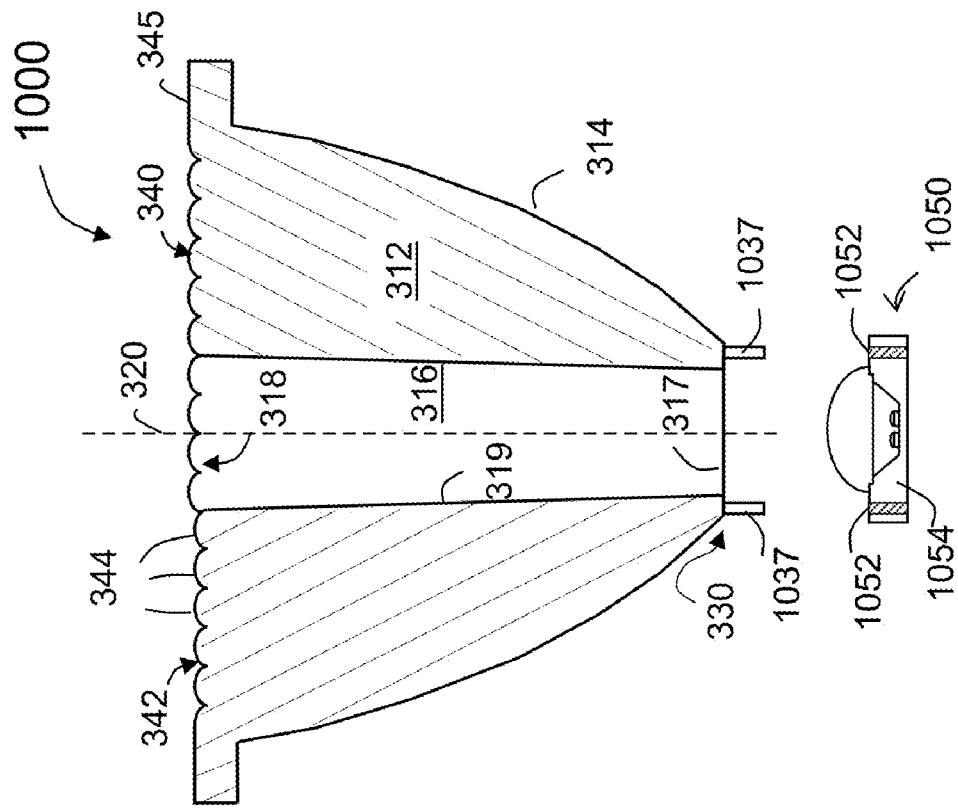
FIG. 10B is a simplified cross-sectional view of a lighting apparatus including the lens of FIG. 10A and a light source according to yet another embodiment of the present invention.
Figure 10A:
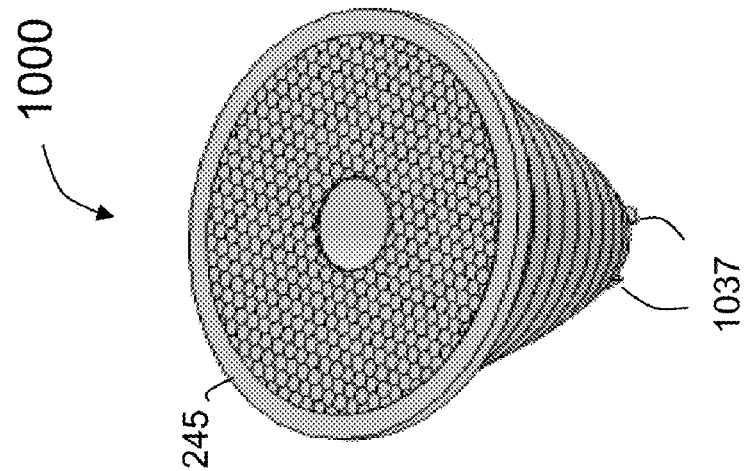
FIG. 10A is simplified perspective view of a lens according to yet another embodiment of the present invention.

FIG. 10A is simplified perspective view of a lens 1000 according to yet another embodiment of the present invention. FIG. 10B is a simplified cross-sectional view of a lighting apparatus including lens 1000 of FIG. 10A and a light source 1050 according to yet another embodiment of the present invention. As shown lens 1000 has similar features to lens 300 described above in connection with FIGS. 3A-3B and 4A-4C. Some of the common features are labeled with the same reference numbers as in FIG. 3A, such as optical body member 312, TIR surface 314, flange 345, interior open channel 316, and microlenses 344, etc.

Additionally, lens 1000 has a number of protrusions 1037 extending from the first end 330 of optical body member 312.

Protrusions 1037 are disposed circumferentially around the first opening 317 of the interior open channel 316, and are arranged to center optical body member 312 and to maintain the optical body member at a predetermined position with respect to a light source.

In an embodiment, the plurality of protrusions 1037 can be made of the same material as optical body member 312. In a specific embodiment, the optical body and the protrusions can be made in a single molding process. In other embodiment, different materials or manufacturing methods can also be used.

In a specific embodiment, lens 1000 can be used with an LED-based light source to form a lighting apparatus. FIG. 10B shows such a lighting apparatus with light source 1050, which may be similar to the LED-based light sources described above, and additionally including notches or slots 1052 within substrate 1054. In this example, protrusions 1037 are shaped to fit into notches 1052 so that lens 1000 is held in a desired alignment in relation to light source 1050. In an embodiment, lens 1000 is configured to produce substantially centered projected light when the LEDs in light source 1050 are positioned off the optical axis.

FIGS. 11A-11D are various additional views of lens 1000 of FIGS. 10A and 10B. Specifically, FIG. 11A is a top view, FIG. 11B is a side view, and FIG. 11C is a bottom view of lens 1000. Additionally, FIG. 11D provides a magnified view of a center portion of the bottom view of FIG. 10C, showing four protrusions 1037 disposed circumferentially around the bottom opening of the lens.

In a specific embodiment, lens 1000 is optimized for a light source having four LED dice in a package that also includes a substrate and a primary lens. In this embodiment, lens 1000 has a height of about 18 mm and a diameter of about 35 mm with a flange region about 2 mm wide. In one example, the microlenses have dimensions R=3.0 mm, h=0.1 mm, and L=1.33 mm for a narrow beam angle, R=2.0 mm, h=0.2 mm, and L=1.51 mm for a medium beam angle, and R=3.0 mm, h=0.55 mm, and L=3.0 mm for a wide beam angle. Additionally, in this embodiment, lens 1000 has four protrusions, each having a height of about 1.2 mm and a cross-section of about 1.5 mm by 0.6 mm.

While certain embodiments of the invention have been illustrated and described, those skilled in the art with access to the present teachings will recognize that the invention is not limited to these embodiments only. Numerous modifications, changes, variations, substitutions, and equivalents will be apparent to those skilled in the art. Accordingly, it is to be understood that the invention is intended to cover all variations, modifications, and equivalents within the scope of the following claims.

What is claimed is:

1. A lens assembly, comprising:
an optical body member having a first end, a second end opposite the first end, and an outer surface, the optical body member being substantially symmetric with respect to an optical axis, the outer surface being shaped to provide total internal reflection for light from a light source having a specified position in relation to the first end, the optical body member further having an interior open channel extending longitudinally from the first end to the second end thereof, the interior open channel being substantially symmetric with respect to the optical axis, the interior open channel having a first opening at the first end for accommodating the light source and a second opening at the second end, the optical body member further having a plurality of refractive surface regions disposed in the second end thereof and around the second opening of the interior open channel; and a holder having a concave interior surface shaped to accommodate the optical body member and a convex exterior surface, the holder having a first opening disposed to surround the first opening of the optical body member and a second opening opposite the first opening, wherein the optical body member is insertable into the holder through the second opening, the holder having three or more support members extending from the exterior surface toward the first opening, the support members being adapted for centering the optical body member with respect to the light source and maintaining the light source in the specified position in relation to the optical body member.

2. The lens assembly of claim 1 wherein the interior open channel is characterized by a substantially cylindrical sidewall extending from the first opening to the second opening of the interior open channel substantially without bending.

3. The lens assembly of claim 1 wherein a side wall of the interior open channel forms an angle of approximately 1 degree with respect to the optical axis.

4. The lens assembly of claim 1 wherein the multiple refractive surface regions comprise hexagonal microlenses in a honeycomb arrangement.

5. The lens assembly of claim 1 wherein the multiple refractive surface regions comprise hexagonal microlenses having a curvature and a lateral dimension selected to provide a predetermined beam width.

6. The lens assembly of claim 1 wherein the holder further comprises one or more clips in an upper rim region thereof for retaining the optical body member.

7. The lens assembly of claim 1 wherein each of the support members of the holder comprises an elongated body having two sections characterized by two different lateral dimensions, respectively.

8. The lens assembly of claim 1 wherein the light source comprises one or more light-emitting diodes (LEDs).

9. The lens assembly of claim 1 wherein the light source comprises one or more light-emitting diodes (LEDs), each of which has a wavelength-shifting material and being adapted to produce white light.

10. The lens assembly of claim 1 wherein the light source comprises 12 or more light-emitting-diodes disposed on a substrate that includes a plurality of notches, and wherein each support member of the holder is configured to fit into one of the plurality of notches in the substrate.

* * * * *